(12) United States Patent
Bakir et al.

(10) Patent No.: US 6,690,081 B2
(45) Date of Patent: Feb. 10, 2004

(54) COMPLIANT WAFER-LEVEL PACKAGING DEVICES AND METHODS OF FABRICATION

(75) Inventors: Muhannad S. Bakir, Atlanta, GA (US); Hollie Reed, Atlanta, GA (US); Paul Kohl, Atlanta, GA (US); Chirag S. Patel, Peekskill, NY (US); Kevin P. Martin, Atlanta, GA (US); James Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/993,100

(22) Filed: Nov. 19, 2001

(65) Prior Publication Data

US 2002/0127768 A1 Sep. 12, 2002

Related U.S. Application Data

(60) Provisional application No. 60/249,897, filed on Nov. 18, 2000.

(51) Int. Cl.[7] .................................................. H01L 29/00
(52) U.S. Cl. ........................ 257/522; 257/792; 257/506; 438/461; 438/421
(58) Field of Search ........................ 438/461, 422, 438/781, 780, 421, 106, 614, 128; 257/522, 506, 735, 759, 790, 792, 782, 786, 690

(56) References Cited

U.S. PATENT DOCUMENTS

| | | | | |
|---|---|---|---|---|
| 4,827,611 A | | 5/1989 | Pai et al. ........................ 29/843 |
| 5,757,072 A | * | 5/1998 | Gorowitz et al. ............ 257/700 |
| 5,864,946 A | | 2/1999 | Eldridge et al. .............. 29/843 |
| 6,080,603 A | | 6/2000 | Distefano et al. ............ 438/117 |
| 6,136,212 A | * | 10/2000 | Mastrangelo et al. ......... 216/49 |
| 6,165,890 A | * | 12/2000 | Kohl et al. .................. 438/619 |
| 6,221,750 B1 | * | 4/2001 | Fjelstad ....................... 438/611 |

OTHER PUBLICATIONS

Bakir; Reed; Mul'; Kohl; Martin; and Meindl; Sea of Leads (SoL.) Ultra High Density Compliant Wafer Level Packaging Technology; Unpublished to date.

Reed; Bakir; Patel; Martin; Meindl; and Kohl; Compliant Wafer Level Package (CWLP) with Embedded Air–gaps For Seal of Leads (SoL) Interconnections; Proc. IEEE International Interconnect Technology Conference. S an Francisco, CA: pp. 151–153; Jun. 2001.

Bakir; Reed; Kohl; Martin; and Meindl; Sea of Leads Ultra High–Density Complaint Wafer–Level Packaging Technology; Unpublished to date.

Bakir; Reed; Mule'; Kohnl; Martin; and Meindl; Sea of Leads (SoL) Characterization and Design for Compatibility With Board–Level Optical Waveguide Interconnection; Unpublished to date.

\* cited by examiner

Primary Examiner—Caridad Everhart
(74) Attorney, Agent, or Firm—Thomas, Kayden, Horstemeyer & Risley, LLP (57) ABSTRACT

Devices and method of fabrication thereof are disclosed. A representative device includes one or more lead packages. The lead packages include a substrate including a plurality of die pads, an overcoat polymer layer, a plurality of sacrificial polymer layers disposed between the substrate and the overcoat polymer layer, and a plurality of leads. Each lead is disposed upon the overcoat polymer layer having a first portion disposed upon a die pad. The sacrificial polymer layer can be removed to form one or more air-gaps.

54 Claims, 6 Drawing Sheets

COMPLIANT WAFER-LEVEL PACKAGING DEVICES AND METHODS OF FABRICATION

CROSS-REFERENCE TO RELATED APPLICATION

This application claims priority to copending U.S. provisional application entitled, "The Utilization of Air Gaps and Mechanical Decoupling for In Plane Ultra High x-y-z Compliant Leads", having Ser. No. 60/249,897, filed Nov. 18, 2000, which is entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of MDA972-99-1-0002 awarded by the DARPA.

TECHNICAL FIELD

The present invention is generally related to integrated circuits and, more particularly, is related to compliant wafer-level packaging devices and methods of fabrication thereof.

BACKGROUND OF THE INVENTION

Conventional chip manufacturing is divided into front-end, back-end, and tail-end processing. Front-end processing refers to the fabrication of CMOS transistors, while back-end processing describes wafer metallization. Tail-end processing refers here to the packaging of the individual dies. Generally, the final wafer-level process step is the fabrication of the die pads, which serve as the interface between the die and the package. Each individual die, while still part of the wafer, is then functionally tested to identify known good die (KGD) followed by wafer singulation. The KGD's are then shipped to a packaging foundry where they are individually temporary package for burn-in. The dies that pass this test are then individually packaged into their final package and tested again for functionality. This final step concludes tail-end processing and the functional packaged dies are finally ready for system assembly.

The mechanical performance of a package is important for wafer-level testing, protection, and reliability. Wafer-level testing requires simultaneous reliable contact to all die across a non-planar wafer surface. In-plane (i.e. x-y axis) compliance is generally required to account for potential problems such as, for example, thermal expansion between the chip and printed wiring board and probe contact with leads. Wafer-level testing and burn-in demands significant out-of-plane (i.e., z-axis) compliance in order to establish reliable electrical contract between the pads on the non-planer wafer and pads/probes on the board surfaces. Non-compliance of the input/output (I/O) interconnects/pads out-of-plane, as well as in-plane (i.e., x-y axis), can cause wafer-level testing problems.

Unlike conventional packaging, wafer-level packaging (WLP) is a continuation of integrated circuit manufacturing. In WLP, additional masking steps can be used after fabricating die pads to simultaneously package all dice across the wafer. A unique class of WLP is called compliant wafer-level packaging (CWLP). In CWLP, additional masking steps can be used after fabricating die pads to batch fabricate compliant x-y-z axis I/O leads between the die pads and the board pads. A mechanically x-y-z flexible lead is formed between the die pad and the bump interconnection that would be joined with the board. Accordingly, there is a need in the industry for x-y-z compliant leads that provide high density, high electrical performance, low cost, and ability of batch fabrication. Thus, a heretofore unaddressed need exists in the industry to address the aforementioned deficiencies and inadequacies.

SUMMARY OF THE INVENTION

A representative device of the present invention includes one or more lead packages. The lead packages include a substrate including a plurality of die pads, an overcoat polymer layer, a plurality of sacrificial polymer layers disposed between the substrate and the overcoat polymer layer, and a plurality of leads. Each lead is disposed upon the overcoat polymer layer having a first portion disposed upon a die pad. The sacrificial polymer layer can be removed to form one or more air-gaps.

The present invention also involves method for fabricating the device described above. A representative method includes: (a) providing a substrate having at least one die pad disposed upon the surface of the substrate; (b) disposing and patterning a first sacrificial polymer layer onto at least one portion of the substrate; (c) disposing an overcoat polymer layer onto the substrate, at least one die pad, and the first sacrificial polymer layer; (d) removing portions of the overcoat polymer layer to expose at least one die pad; (e) disposing a first lead layer onto the at least one die pad and portions of the overcoat polymer layer; and (f) removing the sacrificial layer to define a first air-gap within the overcoat polymer layer.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings. like reference numerals designate corresponding parts throughout the several views.

DETAILED DESCRIPTION

The complaint wafer devices of the present invention exhibit exceptional electrical performance, with resistance, inductance, and capacitance. Consequently, the compliant wafer device may preserve signal integrity, and minimizes ground bounce, cross talk, resistive loses, and heat generation. The compliant wafer device includes one or more lead packages. The methods of fabricating lead packages incorporates air-gaps in the overcoat polymer layer to enhance lead compliance in-plane and out-of-plane (i.e. x-y axis and z axis directions). The compliant lead accounts for mismatch in the coefficient of thermal expansion between the chip and the board and allows the interconnection of chips to boards to expand and/or contact without underfill. In addition, wafer-level functionality testing as well as wafer-level burn-in to identify known good packaged die (KGPD) can be enhanced.

Figure 1A:
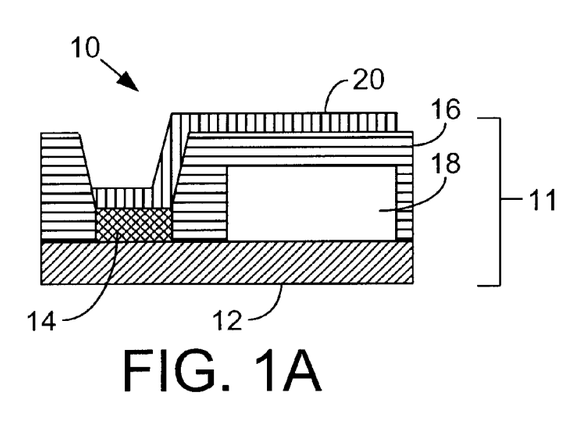
FIG. 1A is a sectional view illustrating a representative embodiment of the compliant wafer device of the present invention.
Figure 1B:
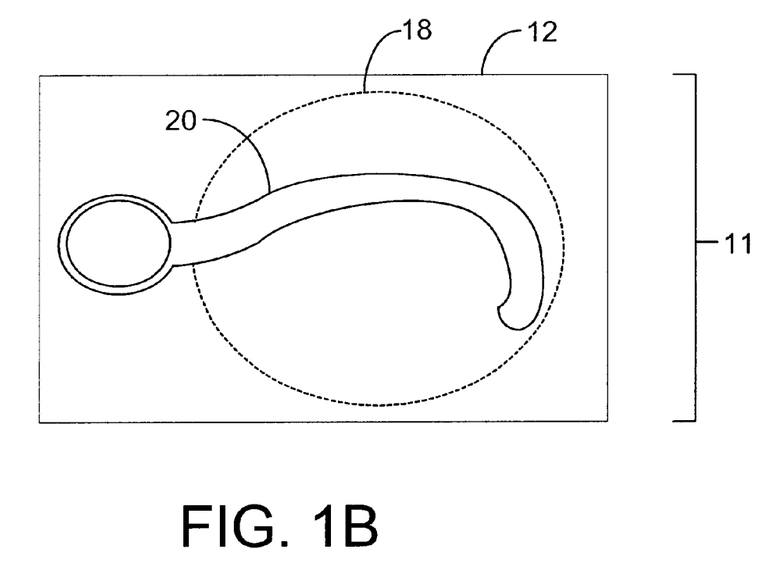
FIG. 1B is a top view illustrating the representative embodiment of the compliant wafer device shown in FIG. 1A.

Reference will now be made to the figures; FIG. 1A illustrates a sectional view of a representative embodiment of compliant wafer device 10. Compliant wafer device 10 includes one or more lead packages 11. The lead package includes a substrate 12, a die pad 14, an overcoat polymer layer 16, an air-gap 18, and a lead 20. The die pad 14 is disposed upon the substrate 12. The overcoat polymer layer 16 is also disposed upon the substrate 12. The air-gap 18 occupies a space bounded by the substrate 12 and the overcoat polymer layer 16. The lead 20 is disposed upon the overcoat polymer layer 16 and die pad 14. A portion of the lead is disposed upon the overcoat polymer layer 16 above the air-gap 18. FIG. 1B is a top-view of compliant wafer device 10 illustrated in FIG. 1A. FIG. 1B illustrates that a portion of the lead 20 is disposed above the air-gap 18. The lead geometry is not limited to that shown in FIG. 1B. Instead, various lead geometries can provide compliance, consistent with the scope of the present invention. Additional steps can be performed to fabricate an attachment or contact on the end portion of the lead, which is disposed above the air-gap. This contact can include a variety of items designed to make a contact or attachment to a pad or point on another substrate. These attachments can be, for example, a solder bump, a conductive adhesive or filled polymer, or a contact probe. These can be formed with methods such as electroplating, electroless plating, screen or stencil printing.

The substrate 12 can be any of a variety of substrates that can be used to support the compliant wafer device. The substrate 12 includes silicon, silicon compounds, germanium, germanium compounds, gallium, gallium compounds, indium, indium compounds, or other semiconductor materials/compounds. Non-semiconductor substrate materials include ceramics and organic boards.

The die pads 14 can be deposited upon the surface of the substrate 12 using techniques such as, for example, sputtering, evaporation, electron-beam systems, electroplating, electro-less plating, and displacement reactions.

The overcoat polymer layer 16 can be any modular polymer that includes the characteristic of being permeable or semi-permeable to the decomposition gases produced by the decomposition of a sacrificial polymer while forming the air-gap 18. In addition, the overcoat polymer layer 16 has elastic properties so as to not rupture or collapse under fabrication and use conditions. Further, the overcoat polymer layer 16 is stable in the temperature range in which the sacrificial polymer decomposes. Furthermore, the overcoat polymer layer 16 enables the lead 20 to be compliant in-plane (i.e., the x-y axis direction) when the lead is adhered to the polymer surface. The lead may be non-adherent to the polymer surface by selecting metal and polymer combinations that are known to form poor adhesion. In addition, the leads can be fabricated on a sacrificial layer, such as a metal or organic material. Examples of the overcoat polymer layer 16 include compounds such as, for example, polyimides, polynorbornenes, epoxides, polyarylenes ethers, and parylenes. More specifically the overcoat polymer layer 16 includes compounds such as Amoco Ultradel™ 7501, BF Goodrich Avatrel™ Dielectric Polymer, DuPont 2611, DuPont 2734, DuPont 2771, and DuPont 2555. The overcoat polymer layer 16 can be deposited onto the substrate 12 using techniques such as, for example, spin coating, doctor-blading, sputtering, lamination, screen or stencil-printing, chemical vapor deposition (CVD), plasma based deposition systems.

The air-gap 18 is formed by the removal (e.g. decomposition) of a sacrificial layer from the area in which the air-gap 18 is located as illustrated in FIGS. 1A and 1B. During the fabrication process of the compliant wafer device 10, a sacrificial layer 18 is deposited onto the substrate 12 and patterned. Thereafter, the overcoat polymer layer 18 is deposited around the sacrificial polymer. Subsequently, the sacrificial polymer is removed forming the air-gap 18. The air-gap 18 enables the lead 20 to be compliant out-of-plane (z axis). The processes for depositing and removing the sacrificial polymer are discussed in more detail hereinafter. The air-gap 18 height can range from about 0.5 to about 300 micrometers and more particularly can range from about 5 to about 50 micrometers. The air-gap 18 radius can range from about 1 to about 300 micrometers and more particularly can range from about 50 to about 250 micrometers.

The sacrificial polymer can be virtually any polymer that slowly decomposes so as to not create too great of a pressure while forming the air-gap 18. In addition, the decomposition of the sacrificial polymer produces gas molecules small enough to permeate the overcoat polymer layer 16. Further, the sacrificial polymer has a decomposition temperature less than the decomposition or degradation temperature of the overcoat polymer layer 16. Examples of the sacrificial polymer include compounds such as polynorbornenes, polycarbonates, polyethers, and polyesters. More specifically the sacrificial polymer includes compounds such as BF Goodrich Unity™ 400, polypropylene carbonate, polyethylene carbonate, and polynorborene carbonate. The sacrificial material may also contain photosensitive compounds which are additives for patterning or decomposition.

The sacrificial polymer layer 16 can be deposited onto the substrate using techniques such as, for example, spin coating, doctor-blading, sputtering, lamination, screen or stencil-printing, melt dispensing, chemical vapor deposition (CVD), and plasma based deposition systems.

The height of the sacrificial polymer can range from about 0.5 to about 300 micrometers and preferable in the range of about 5 to about 50 micrometers. The radius of the sacrificial polymer can range from about 1 to about 300 micrometers and more particularly can range from about 50 to about 250 micrometers. In general, the thickness of the sacrificial polymer (i.e. ultimately the height of the air-gap) is controlled by both the weight fraction of the sacrificial polymer in solution as well as the deposition technique.

The sacrificial polymer can be removed by thermal decomposition, ultra violet irradiation, etc., or patterned directly during application, i.e. screen-printing. The thermal decomposition of the sacrificial polymer can be performed by heating the compliant wafer device 10 to the decomposition temperature of the sacrificial polymer and holding at that temperature for a certain time period (e.g. 1–2 hours). Thereafter, the decomposition products diffuse through the overcoat polymer layer 18 leaving a virtually residue-free hollow structure (air-gap).

The lead 20 can be fabricated of any single layer or layers of different metals, metal composites, dielectrics, superconductors, organic conductors, or light emitting organic materials appropriate for the compliant wafer device 10. The metals and metal composites include gold, gold alloys, copper, and copper alloys. The lead 20 can be fabricated by monolithically electroplating the selected metal or metal composite onto the compliant wafer device. The lead 20 can range from about 1 to about 100 micrometers in thickness and preferably from about 4 to about 40 micrometers. The preferred embodiment has a thickness of about 15 micrometers The lead 20 lengths can range from about 2 and about 400 micrometers and preferably from about 40 to about 120 micrometers. The lead 20 width can range from about 1 to about 100 micrometers and preferable from about 2 to about 40 micrometers. The preferred embodiment has a width in the range of about 15 to about 25 micrometers.

The lead 20 can be compliant in-plane and out-of-plane. The shape of the lead along with the overcoat polymer layer 16 provides compliance in-plane, while the air-gap 16 provides compliance out-of-plane. The lead 20 is compliant in-plane in the range of about 1 to about 100 micrometer and preferable from about 1 to about 50 micrometers. In addition, the lead 20 is compliant out-of-plane in the range of about 1 to about 100 micrometer and preferable from about 1 to about 50 micrometers.

For the purposes of illustration only, and without limitation, embodiments of the present invention will be described with particular reference to the below-described fabrication methods. Note that not every step in the process is described with reference to the process described in the figures hereinafter. For example, photolithography or similar techniques can be used to define the overcoat polymer layer 16, sacrificial polymer (air-gap 18), and/or lead pattern. In this regard, the pattern can be defined by depositing material onto the surface of the substrate 12 using techniques such as, for example, sputtering, chemical vapor deposition (CVD), plasma based deposition systems, evaporation, electron-beam systems. Furthermore, the pattern can then be removed using reactive ion etching techniques (RIE), for example. Therefore, the following fabrication processes is not intended to be an exhaustive list that includes every step required to fabricate the embodiments of the compliant wafer devices.

Figure 2A:
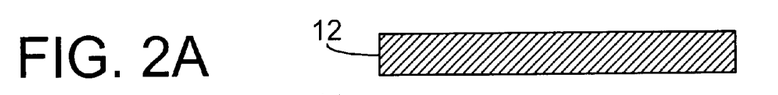
FIGS. 2A–2G are sectional views that illustrate a representative process of fabricating the compliant wafer device shown in FIGS. 1A and 1B.
Figure 2B:
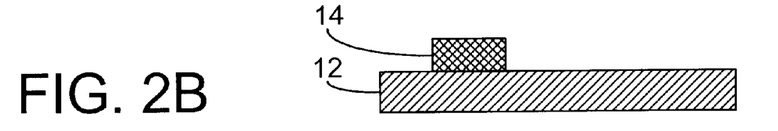
Figure 2C:
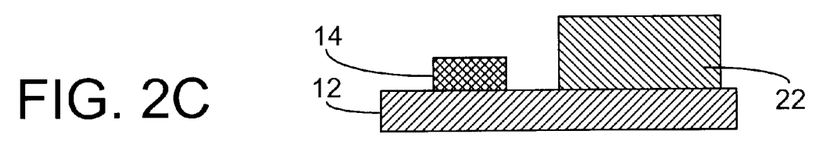
Figure 2D:
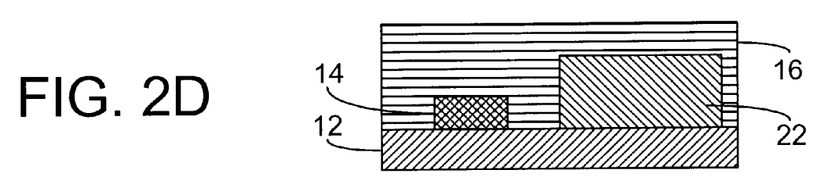
Figure 2E:
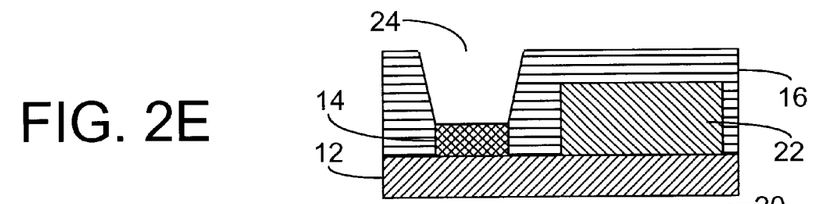
Figure 2F:
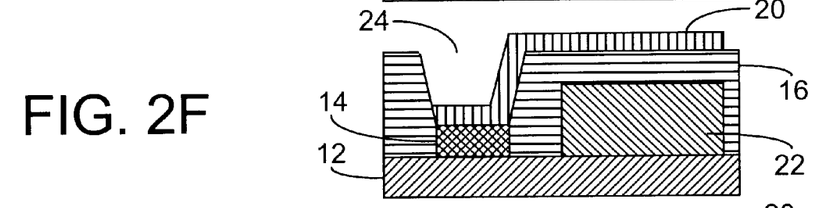
Figure 2G:
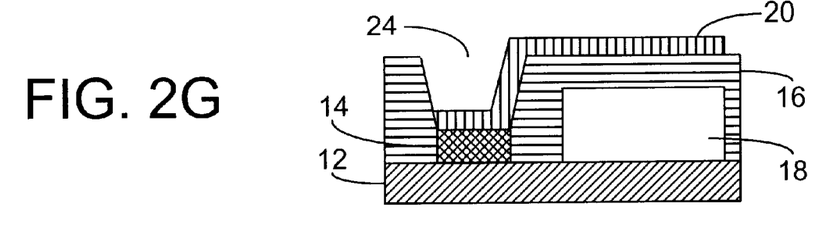
Figure 3A:
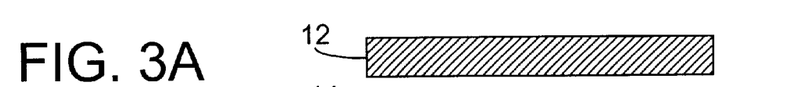
FIGS. 3A–3G are sectional views that illustrate another representative process of fabricating the compliant wafer device shown in FIGS. 1A and 1B.
Figure 3B:
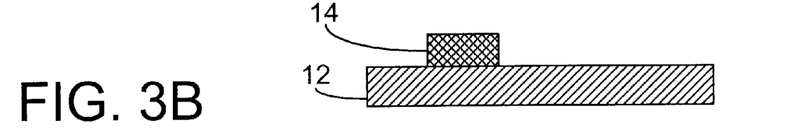
Figure 3C:
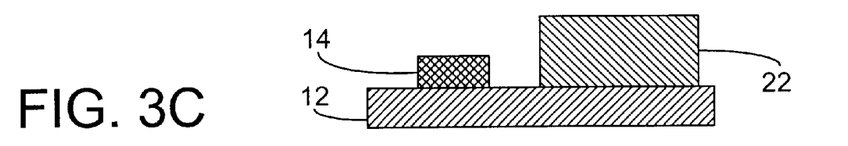
Figure 3D:
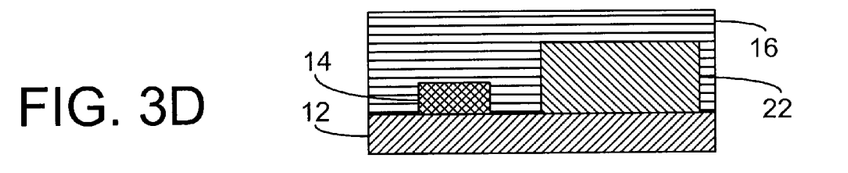
Figure 3E:
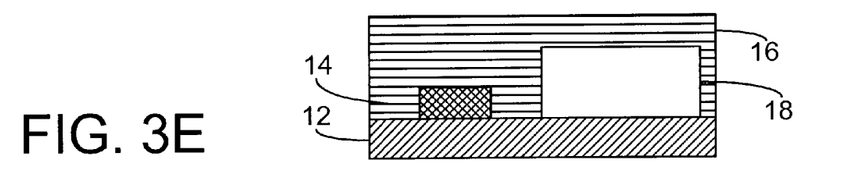
Figure 3F:
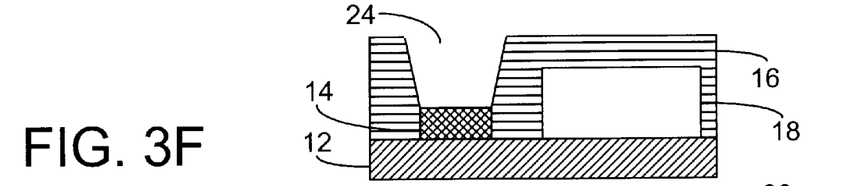
Figure 3G:
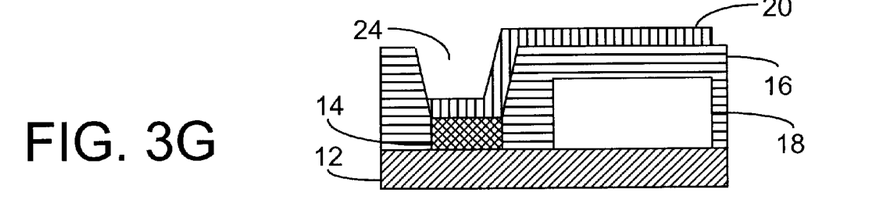

FIGS. 2A–2G are sectional views that illustrate a representative process for fabricating the lead package 11 for the compliant wafer device 10 illustrated in FIGS. 1A and 1B. FIG. 2A illustrates a substrate 12, and FIG. 2B illustrates the substrate 12 having a die pad 14 disposed upon the substrate 12. FIG. 2C illustrates a sacrificial polymer 22 disposed upon the substrate 12. The sacrificial polymer 22 is disposed in the space that the air-gap 18 is subsequently formed. FIG. 2D illustrates the addition of the overcoat polymer layer 16 disposed over the die pad 14 and sacrificial polymer 22. FIG. 2E illustrates via 24 etched into the overcoat polymer layer 16 to expose the die pad 14. The via 24 can be etched using techniques such as, for example, RIE, photo-definition, and laser drilling. FIG. 2F illustrates the lead 20 disposed upon the overcoat polymer layer 16 and the die-pad 14. A portion of the lead is disposed above the overcoat polymer portion, which is above the sacrificial polymer 22. FIG. 2G illustrates compliant wafer device 10 after the sacrificial polymer 22 has been removed and consequently forming air-gap 18. As indicated above, the air-gap 18 enhances compliance of lead 20 out-of-plane.

FIGS. 3A–3G are sectional views that illustrate an alternative process for fabricating the lead package 11 for the compliant wafer device 10. Similar to FIGS. 2A–2C, FIGS. 3A–3C illustrate a process where the die pad 14 and sacrificial polymer 22 have been disposed upon the substrate 12. Thereafter, the overcoat polymer layer 16 is disposed upon the die pad 14, sacrificial polymer 22, and substrate 12. Unlike the process illustrated in FIGS. 2A–2G, the sacrificial polymer 22 is removed prior to the addition of lead 20, as shown in FIG. 2E. Removal of the sacrificial polymer 22 forms air-gap 18. FIG. 2F illustrates that via 24 is etched into the overcoat polymer layer 16 to expose die pad 12. FIG. 2G illustrates lead 20 disposed upon a portion of the overcoat polymer layer 16 and the die pad 14. The processes for fabricating compliant wafer device 10 illustrated in FIGS. 2A–2G and 3A–3G are different in that the sacrificial layer 22 is removed at different steps.

Figure 4:
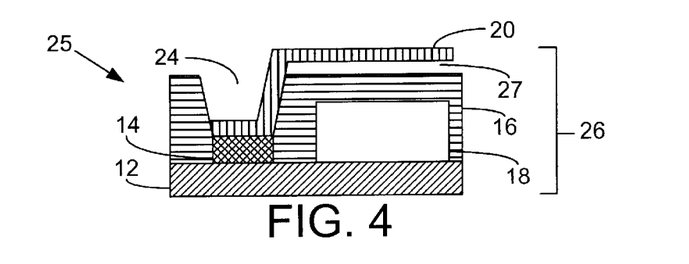
FIG. 4 is a sectional view that illustrates another embodiment of the compliant wafer device.

FIG. 4 is a sectional view that illustrates another embodiment of the compliant wafer device 25 exhibiting a second air-gap 27. Compliant wafer device 25 illustrated in FIG. 4 is similar to the compliant wafer device 10 except that lead 20 in compliant wafer device 25 exhibits second air-gap 27 between lead 20 and the overcoat polymer layer 16. The second air-gap 27 provides lead 20 additional compliance out-of-plane.

Figure 5A:
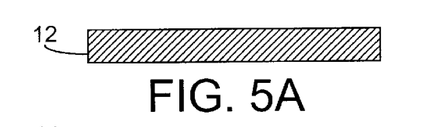
FIGS. 5A–5H are sectional views that illustrate a representative process of fabricating another embodiment of the compliant wafer device shown in FIG. 4.
Figure 5B:
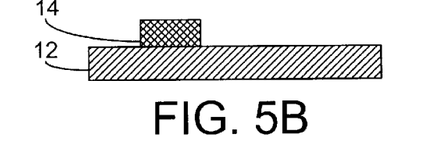
Figure 5C:
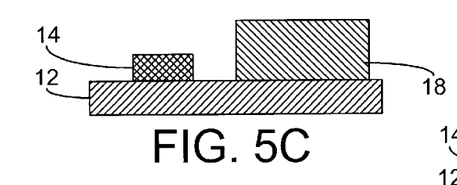
Figure 5D:
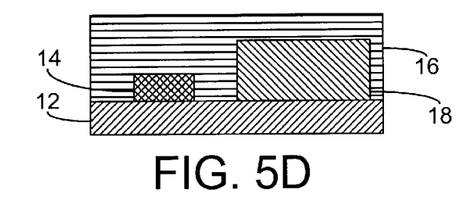
Figure 5E:
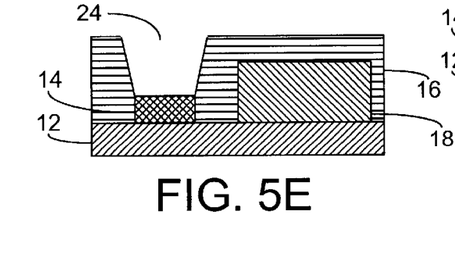
Figure 5F:
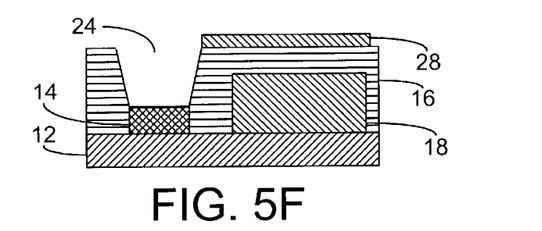
Figure 5G:
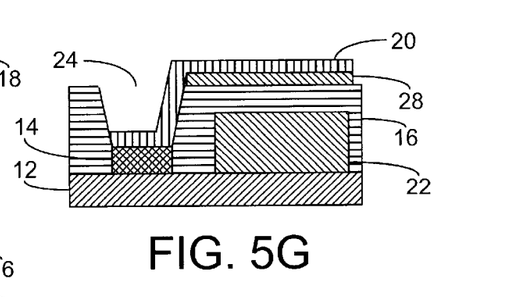
Figure 5H:
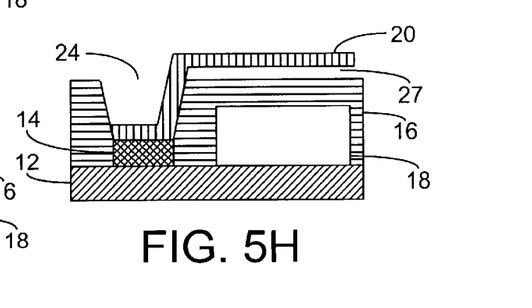

FIGS. 5A–5F are sectional views that illustrate a representative process for fabricating the lead package 26 for the compliant wafer device 25 illustrated in FIG. 4. Similar to FIGS. 2A–2E, FIGS. 5A–5E illustrate a process where the overcoat polymer layer 16 is disposed upon the die pad 14, (first) sacrificial polymer 22, and the substrate 12. In addition, via 24 has been etched into the overcoat polymer layer 16 exposing the die pad 14. FIG. 5F illustrates the addition of a second sacrificial polymer 28 disposed upon a portion of the overcoat polymer layer 16. The second sacrificial polymer 28 is disposed upon the portion of the overcoat polymer layer 16 that lead 20 is subsequently going to be disposed upon. FIG. 5G illustrates lead 20 disposed upon the die pad 14, the overcoat polymer layer 16, and the second sacrificial polymer 28. FIG. 5F illustrates the compliant wafer device 25 after the first sacrificial polymer 22 and the second sacrificial polymer 28 have been removed. Removal of the first sacrificial polymer 22 creates air-gap 18, while removal of the second sacrificial polymer 28 creates second air-gap 27. The second air-gap can also be fabricated by choosing a seed layer different from the metal lead then selectively etching this metal seed layer from underneath the lead.

Figure 6:
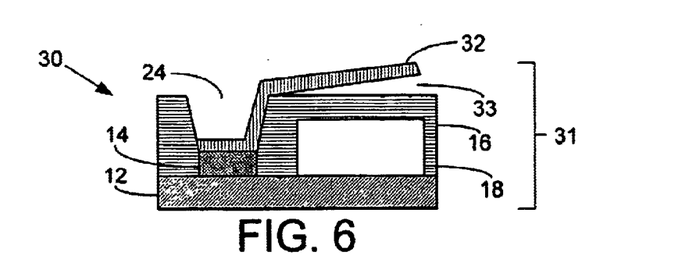
FIG. 6 is a sectional view that illustrates another embodiment of the compliant wafer device.

FIG. 6 is a sectional view of another embodiment of compliant wafer device 30. Compliant wafer device 30 is similar to compliant wafer device 10 except that lead 32 exhibits a stress gradient. The stress gradient is created by forming lead 32 with two layers. The stress gradient between the two layers of the lead 32 causes the lead 32 to incline in the z-axis direction away from the overcoat polymer layer 16. The incline creates a third air-gap 33 between lead 32 and the overcoat polymer layer 16. The third air-gap 33 enhances the compliance of lead 32 out-of-plane.

Figure 7A:
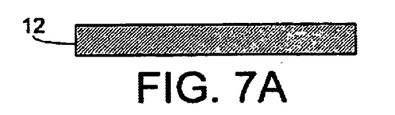
FIGS. 7A–7I are sectional views that illustrate a representative process of fabricating another embodiment of the compliant wafer device as shown in FIG. 6.
Figure 7B:
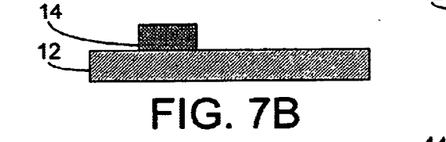
Figure 7C:
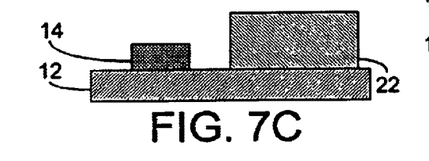
Figure 7D:
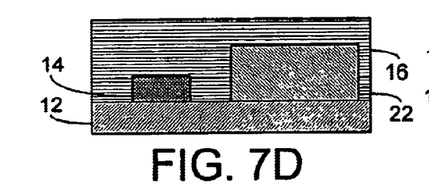
Figure 7E:
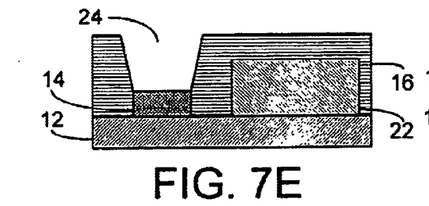
Figure 7F:
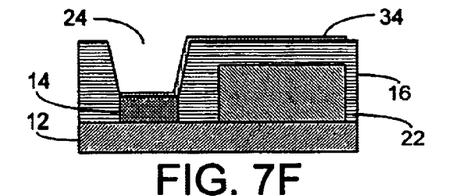
Figure 7G:
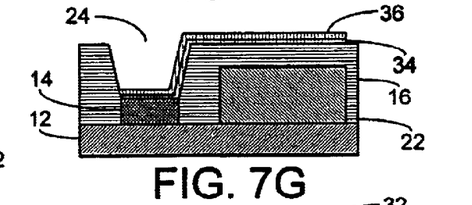
Figure 7H:
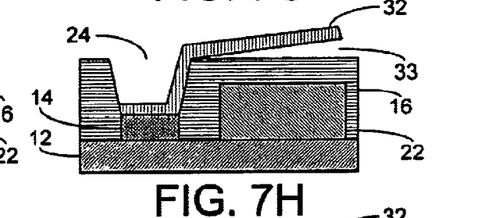
Figure 7I:
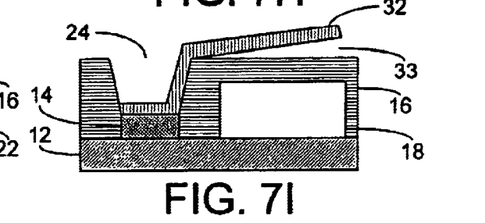

FIGS. 7A–7I are sectional views that illustrate the process for fabricating the lead package 31 (FIG. 6) for the compliant wafer device 30. Similar to FIGS. 2A–2E, FIGS. 7A–7E illustrate a process where the overcoat polymer layer 16 is disposed upon the die pad 14, sacrificial polymer 22, and the substrate 12. In addition, via 24 has been etched into the overcoat polymer layer 16 exposing the die pad 14. FIG. 7F illustrates the first lead layer 34 disposed upon a portion of the overcoat polymer layer 16. FIG. 7G illustrates the second lead layer 36 disposed upon the first lead layer 34 thereby forming the lead layer 32. FIG. 7H illustrates the incline of the lead 32 caused by the stress gradient between the first and second lead layers 34 and 36. FIG. 7I illustrates air-gap 18 formed by the removal of the sacrificial polymer 22.

Each of the processes illustrated in FIGS. 2A–2G, 3A–3G, 5A–5F, and 7A–7I may be performed in a different sequence. In addition, the removal of sacrificial polymer 22 and the second sacrificial polymer 28 can be performed as different process stages, like those illustrated in FIGS. 2A–2G and 3A–3G. Further, a second sacrificial polymer 28 can be used in the process to form compliant wafer device 30 in FIG. 6. Therefore, these and other variations known to one skilled in the art of the fabrication processes described are included herein.

Figure 8:
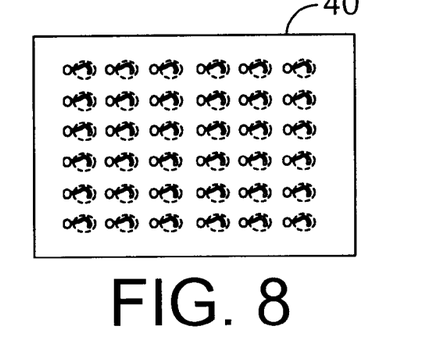
FIG. 8 is a sectional view that illustrates many lead packages.

FIGS. 1–7 illustrated compliant wafer devices having only one lead package, which was done to clearly describe the compliant wafer devices and the fabrications processes. However, many lead packages can be disposed upon a compliant wafer device. FIG. 8 is a sectional view that illustrates that many lead packages can be fabricated upon a compliant wafer device 40. The number of leads can range from about 10 to about 100,000 leads per centimeter squared ($cm^2$) and preferable from about 1,000 to about 30,000 leads per $cm^2$. The number of leads in the preferred embodiment can range from about 10,000 to about 15,000 leads per $cm^2$.

Figure 9:
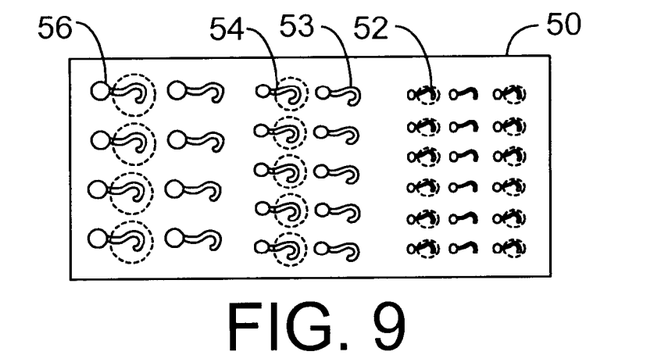
FIG. 9 is a section view that illustrates lead packages of multiple sizes.

FIG. 9 is a sectional view that illustrates that lead packages 52, 54, and 56 of multiple sizes can be fabricated upon a compliant wafer device 50. In addition, FIG. 9 illustrates that lead packages 54 and 53 with and without air-gaps can be fabricated upon the same compliant wafer device 50.

Figure 10:
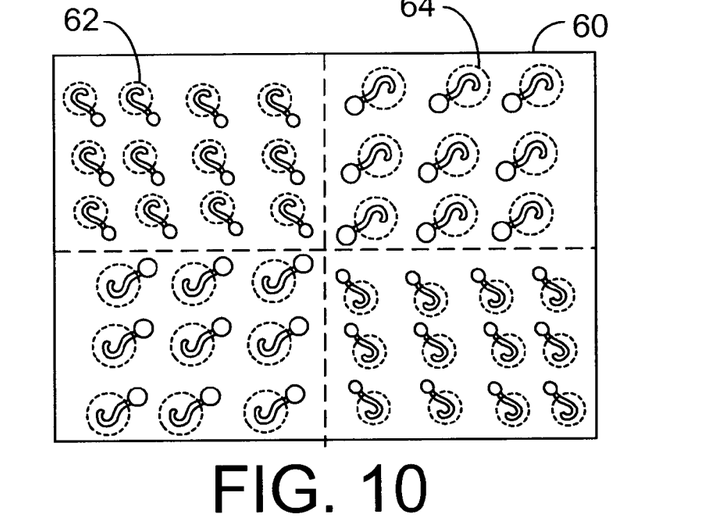
FIG. 10 is a section view that illustrates lead packages of multiple sizes.

FIG. 10 is a sectional view that illustrates that the lead packages 62 and 64 can be oriented to maximize the density and in-plane compliance of leads upon the compliant wafer device 60. FIG. 10 illustrates that lead packages 62 and 64 of multiple sizes can be fabricated upon the same compliant wafer device 60.

The fabrication processes illustrated in FIGS. 2–7 are very low cost wafer packaging processes. These processes use parallel processing in which all dies on a compliant wafer device are packaged and tested simultaneously. By contrast, conventional packaging is a serial process in which a wafer is sawed up and the individual dice are individually packaged and tested. As a result, these processes offer substantial time and cost savings.

The electrical performance of the compliant wafer devices 10, 25, and 30 is good in the direct current to microwave frequencies. Due to the short lead 20 and 32 length, the inductance, resistance, and capacitance is minimal. As a result, the package leads 11, 26, and 31 can preserve signal integrity and minimize ground bounce, cross talk, and resistive losses, and heat generation. Some of the benefits to of the compliant wafer devices 10, 25, 30, 40, 50, and 60 having ultra high I/O density include enhancement of chip's power wiring distribution, increase in input/output bandwidth, satisfy 3D structure I/O demands, suppression of simultaneous switching noise, and improve isolation in a mixed signal systems as well as enhancing chip testing due to ability to gain access to a greater number of internal chip nodes/cells. In addition, the compliant wafer devices 10, 25, 30, 40, 50, and 60 can be attached to a board with much higher coefficient of thermal expansion without underfill because the leads 20 and 31 are flexible in-plane and out-of-plane. Additionally, not only does this reduce the cost of assembly, but it also enhances reliability. This compliant package can be integrated with optical and RF interconnects as well as micro-electro mechanical devices. Furthermore, the simplification of the chip testing procedure substantially reduces testing time and cost.

It should be emphasized that the above-described embodiments of the present invention, particularly, any "preferred" embodiments, are merely possible examples of implementations, merely set forth for a clear understanding of the principles of the invention. For example, the overcoat polymer layer can be replaced with other overcoat materials that have the same or similar characteristics as the overcoat polymer layer. The other overcoat materials can include overcoat organic and non-organic overcoat materials. Another example includes having multiple air-gaps or stacked air-gaps within the overcoat polymer layer. The stacked air-gaps could be fabricated by forming alternating sacrificial polymer layers and overcoat polymer layers. One skilled in the art could provide various types of configurations for forming the air-gaps and these configurations are intended to be included within the scope of this disclosure.

Therefore, many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, the following is claimed:

1. A device comprising:
   a substrate including a plurality of die pads, an overcoat polymer layer, a plurality of sacrificial polymer layers disposed between the substrate and the overcoat polymer layer, and a plurality of leads, each lead disposed upon the overcoat polymer layer having a first portion disposed upon a die pad, wherein the sacrificial polymer layer can be removed to form a plurality of air-gaps, and wherein the sacrificial polymer layer is a polyimide.

2. The device of claim 1, wherein the sacrificial layer height is about 5 micrometer to about 50 micrometers and the radius is about 50 micrometer to about 250 micrometers.

3. The device of claim 1, wherein the overcoat polymer layer is polynorborene carbonate.

4. The device of claim 1, wherein the compounds include photosensitive compound additives.

5. The device of claim 1, wherein the lead has a stress gradient which causes an upper portion of the lead to incline so that a space is formed between the lead and the overcoat polymer layer.

6. The device of claim 1, wherein there is a second sacrificial polymer layer disposed between an upper portion of the lead and the overcoat polymer layer, wherein the second polymer can be removed to form a second air-gap between the lead and the overcoat polymer layer.

7. The device of claim 1, wherein the overcoat polymer layer includes compounds selected from polyimides, epoxides, polynorbornenes, polyarylene ethers, and parylenes.

8. A device comprising:
   a substrate including a plurality of die pads, an overcoat polymer layer, a plurality of sacrificial polymer layers disposed between the substrate and the overcoat polymer layer, and a plurality of leads, each lead disposed upon the overcoat polymer layer having a first portion disposed upon a die pad, wherein the sacrificial polymer layer can be removed to form a plurality of air-gaps.

9. The device of claim 8, wherein there is a second sacrificial polymer layer disposed between an upper portion of the lead and the overcoat polymer layer, wherein the second polymer layer can be removed to form a second air-gap between the lead and the overcoat polymer layer.

10. The device of claim 8, wherein the overcoat polymer layer includes compounds selected from polyimides, epoxides, polynorbornenes, polyarylene ethers, and parylenes.

11. The device of claim 8, wherein the sacrificial polymer includes compounds selected from polynorbornenes, polycarbonates, polyethers, and polyesters.

12. The device of claim 11, wherein the compounds include photosensitive compound additives.

13. The device of claim 8, wherein the lead has a stress gradient which causes an upper portion of the lead to incline so that a space is formed between the lead and the overcoat polymer layer.

14. A device comprising:
   a lead package, wherein the lead package includes a die pad, an overcoat polymer layer, a sacrificial polymer layer disposed between a substrate and the overcoat polymer layer, and a lead, the lead disposed upon the overcoat polymer layer having a first portion disposed upon the die pad, wherein the sacrificial polymer layer can be removed to form an air-gap.

15. The device of claim 14, including about 10 lead packages to about 100,000 lead packages per centimeter squared.

16. The device of claim 14, including about 10,000 lead packages to about 20,000 lead packages per centimeter squared.

17. The device of claim 14, wherein the air-gap height is about 0.5 micrometer to about 300 micrometers and the radius is about 1 micrometer to about 300 micrometers.

18. The device of claim 14, wherein the sacrificial layer height is about 0.5 micrometer to about 3000 micrometers and the radius is about 1 micrometer to about 300 micrometers.

19. The device of claim 14, wherein the sacrificial polymer includes compounds selected from polynorbornenes, polycarbonates, polyethers, and polyesters.

20. The device of claim 14, wherein the overcoat polymer layer includes compounds selected from polyimides, epoxides, polynorbornenes, polyarylene ethers, and parylenes.

21. A method for fabricating a wafer-level device comprising:
   (a) providing a substrate having at least one die pad disposed upon a surface of the substrate;
   (b) disposing a first sacrificial polymer layer onto at least one portion of the substrate;
   (c) disposing an overcoat polymer layer onto the substrate, at least one die pad, and the first sacrificial polymer layer;
   (d) removing portions of the overcoat polymer layer to expose at least one die pad;
   (e) disposing a first lead layer onto the at least one die pad and portions of the overcoat polymer layer; and
   (f) removing the sacrificial layer to define a first air-gap within the overcoat polymer layer.

22. The method of claim 21, further including:
   disposing a second sacrificial layer onto portions of the overcoat polymer layer after (c) and before (d).

23. The method of claim 22, wherein (f) further includes:
   removing the second sacrificial layer to define a second air-gap between the lead and overcoat polymer layer.

24. The method of claim 21, wherein (e) includes disposing a second lead layer onto the first lead layer forming a third lead that has a stress gradient which causes an upper portion of said third lead to incline so that a third air-gap is formed between the third lead and the overcoat polymer layer.

25. A method for fabricating a wafer-level device comprising:
   (a) providing a substrate having at least one die pad disposed upon a surface of the substrate;
   (b) disposing a sacrificial polymer layer onto at least one portion of the substrate;
   (c) disposing an overcoat polymer layer onto the substrate, at least one die pad, and the sacrificial polymer layer;
   (d) removing portions of the overcoat polymer layer to expose at least one die pad;
   (f) removing the sacrificial layer to define a first air-gap within the overcoat polymer layer; and
   (e) disposing a first lead layer onto the at least one die pad and portions of the overcoat polymer layer.

26. The method of claim 25, wherein the sacrificial polymer layer is selected from polynorbornenes, polycarbonates, polyethers, and polyesters.

27. The method of claim 25, wherein the compounds include photosensitive compound additives.

28. The method of claim 25, wherein the overcoat polymer layer is selected from polyimides, polynorbornenes, epoxides, polyarylene ethers, and parylenes.

29. The method of claim 25, wherein the sacrificial polymer layer height is about 5 micrometers to about 50 micrometers and the radius is about 50 micrometers to about 300 micrometers.

30. A method for fabricating a compliant wafer device having a plurality of lead packages, comprising:
   (a) providing a substrate having a plurality of die pads disposed upon the surface of the substrate;
   (b) disposing a first sacrificial polymer layer onto at least one portion of the substrate;
   (c) disposing an overcoat polymer layer onto the substrate, the plurality of die pads, and the first sacrificial polymer layer;
   (d) removing portions of the overcoat polymer layer to expose the plurality of die pads; and
   (e) disposing a first lead layer onto the plurality of die pads and portions of the overcoat polymer layer; and
   (f) removing the sacrificial layer to define a plurality of first air-gaps within the overcoat polymer layer.

31. The method of claim 30, wherein the compliant wafer device includes about 10 lead packages to about 100,000 lead packages per centimeter squared.

32. A method for fabricating a compliant wafer device having a plurality of lead packages, comprising:

(a) providing a substrate having a plurality of die pads disposed upon the surface of the substrate;
(b) disposing a first sacrificial polymer layer onto at least one portion of the substrate;
(c) disposing an overcoat polymer layer onto the substrate, the plurality of die pads, and the first sacrificial polymer layer;
(d) removing portions of the overcoat polymer layer to expose the plurality of die pads;
(e) removing the sacrificial layer to define a plurality of first air-gaps within the overcoat polymer layer; and
(f) disposing a first lead layer onto the plurality of die pads and portions of the overcoat polymer layer.

33. The method of claim 32, wherein the compliant wafer device includes about 10 lead packages to about 100,000 lead packages per centimeter squared.

34. A device comprising:
a substrate including an overcoat polymer layer and a plurality of sacrificial polymer layers disposed between the substrate and the overcoat polymer layer, wherein the overcoat polymer layer is polynorborene carbonate.

35. The device of claim 34, wherein the sacrificial layer height is about 5 micrometer to about 50 micrometers and the radius is about 50 micrometer to about 250 micrometers.

36. The device of claim 34, wherein the sacrificial layer comprises a polyimide.

37. The device of claim 34, wherein the sacrificial polymer includes compounds selected from polynorbornenes, polycarbonates, polyethers, and polyesters.

38. The device of claim 37, wherein the compounds include photosensitive compound additives.

39. The device of claim 34, wherein the lead has a stress gradient which causes an upper portion of the lead to incline so that a space is formed between the lead and the overcoat polymer layer.

40. A device comprising:
a plurality of lead packages having a substrate, wherein each lead package includes an overcoat polymer layer and a sacrificial polymer layer disposed between the substrate and the overcoat polymer layer, wherein the overcoat polymer layer is polynorborene carbonate.

41. The device of claim 40, wherein the plurality of lead packages comprises about 10 lead packages to about 100,000 lead packages per centimeter squared of the device.

42. The device of claim 40, wherein the plurality of lead packages comprises about 10,000 lead packages to about 20,000 lead packages per centimeter squared of the device.

43. The device of claim 40, wherein the sacrificial layer comprises a polyimide.

44. The device of claim 40, wherein the overcoat polymer layer includes compounds selected from polyimides, epoxides, polynorbornenes, polyarylene ethers, and parylenes.

45. The device of claim 40, wherein the sacrificial polymer includes compounds selected from polynorbornenes, polycarbonates, polyethers, and polyesters.

46. A method for fabricating a compliant wafer device, comprising:
providing a substrate having a plurality of die pads disposed upon the surface of the substrate;
disposing a first sacrificial polymer layer onto at least one portion of the substrate;
disposing an overcoat polymer layer onto the substrate, the plurality of die pads, and the first sacrificial polymer layer;
removing portions of the overcoat polymer layer to expose the plurality of die pads; and
disposing a first lead layer onto the plurality of die pads and portions of the overcoat polymer layer;
removing the sacrificial layer to define a plurality of first air-gaps within the overcoat polymer layer; and
forming a plurality of lead packages.

47. The method of claim 46, wherein forming a plurality of lead packages includes forming about 10 lead packages to about 100,000 lead packages per centimeter squared of the substrate.

48. The method of claim 46, wherein forming a plurality of lead packages includes forming about 10,000 lead packages to about 20,000 lead packages per centimeter squared of the substrate.

49. A device comprising:
a substrate including an overcoat polymer layer and a plurality of sacrificial polymer layers disposed between the substrate and the overcoat polymer layer, wherein a lead has a stress gradient which causes an upper portion of the lead to incline so that a space is formed between the lead and the overcoat polymer layer.

50. The device of claim 49, wherein the sacrificial layer height is about 5 micrometer to about 50 micrometers and the radius is about 50 micrometer to about 250 micrometers.

51. The device of claim 49, wherein the sacrificial layer comprises a polyimide.

52. The device of claim 49, wherein the overcoat polymer layer includes compounds selected from polyimides, epoxides, polynorbornenes, polyarylene ethers, and parylenes.

53. The device of claim 49, wherein the sacrificial polymer includes compounds selected from polynorbornenes, polycarbonates, polyethers, and polyesters.

54. The device of claim 53, wherein the compounds include photosensitive compound additives.

* * * * *

UNITED STATES PATENT AND TRADEMARK OFFICE
CERTIFICATE OF CORRECTION

PATENT NO.      : 6,690,081 B2
DATED           : February 10, 2004
INVENTOR(S)     : Bakir et al.

It is certified that error appears in the above-identified patent and that said Letters Patent is hereby corrected as shown below:

Column 3,
Line 11, after the word "The", delete "complaint" and replace with -- compliant --
Lines 18-19, after the phrase "lead packages", delete "incorporates" and replace with -- incorporate --.
Line 24, after the phrase "and/or", delete "contact" and replace with -- contract --
Line 30, after the word "of", add the word -- a --

Column 4,
Line 19, after the first occurrence of the word "DuPont", add the superscript -- ™ --
Line 19, after the second occurrence of the word "DuPont", add the superscript -- ™ --
Line 19, after the third occurrence of the word "DuPont", add the superscript -- ™ --
Line 20, after the first occurrence of the word "DuPont", add the superscript -- ™ --
Line 23, after the word "example", delete "spin coating" and replace with -- spin-coating --
Line 25, after the phrase "(CVD),", add the word -- and --
Lines 58-59, after the word "example", delete "spin coating" and replace with -- spin-coating --
Line 60, after the phrase "stencil-printing", delete "melt dispensing" and replace with -- melt-dispensing --
Line 63, after the word "and" delete "preferable" and replace with -- is preferably --

Column 5,
Line 26, after the number "2", delete "and" and replace with -- to --
Line 26, after the word "micrometers", add -- , --
Line 26, after the word "and", add the word -- is --
Line 28, after the word "micrometers" add -- , --
Line 28, after the word "and", delete "preferable", and replace with -- preferably --
Line 36, after the number "100", delete "micrometer" and replace with -- micrometers, --
Line 37, at the beginning of the line, delete "preferable", and replace with -- is preferably --
Line 39, after the number "100", delete "micrometer" and replace with -- micrometers, --
Line 39, after the word "and", delete "preferable" and replace with -- is preferably --

Column 6,
Line 16, after the number "10", add the phrase -- of FIGs. 1A and 1B --
Line 23, after the word "FIG.", delete "2E" and replace with -- 3E --
Line 24, after the word "FIG.", delete "2F" and replace with -- 3F --
Line 25, after the word "FIG.", delete "2G" and replace with -- 3G --

UNITED STATES PATENT AND TRADEMARK OFFICE
CERTIFICATE OF CORRECTION

PATENT NO. : 6,690,081 B2
DATED : February 10, 2004
INVENTOR(S) : Bakir et al.

It is certified that error appears in the above-identified patent and that said Letters Patent is hereby corrected as shown below:

<u>Column 6, "cont'd"</u>
Line 39, after te word "FIGS.", delete "5A– 5F" and replace with -- 5A–5H"
Line 53, after the word 'FIGS." delete "5F" and replace with -- 5H --

<u>Column 7,</u>
Line 21, after the phrase "3A–3G", delete "5A–5F" and replace with -- 5A–5H --
Line 38, after the phrase "(cm$^2$)", add -- , --
Line 38, after the word "and" delete "preferable" and replace with -- preferably --
Line 67, after the word "benefits", delete the word "to"

<u>Column 8,</u>
Line 3, after the word "distribution", delete "increase in" and replace with
-- increasing --
Line 4, after the word "bandwidth" delete "satisfy" and replace with -- satisfaction of --
Line 5, after the word "and", delete "improve" and replace with -- improving --
Line 6, after the word "signal", delete "systems" and replace with -- system --
Line 9, after the word "with", add the word -- a --

Signed and Sealed this

Eighth Day of June, 2004

JON W. DUDAS
*Acting Director of the United States Patent and Trademark Office*